US012563994B2

(12) United States Patent
Pai et al.

(10) Patent No.: US 12,563,994 B2
(45) Date of Patent: Feb. 24, 2026

(54) BREAKING-IN AND CLEANING METHOD AND APPARATUS FOR WAFER-CLEANING BRUSH

(71) Applicant: Taiwan Semiconductor Manufacturing Company, Ltd., Hsinchu (TW)

(72) Inventors: Chia-Ling Pai, Taichung City (TW); Yu-Min Chang, Hsinchu City (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 18/500,849

(22) Filed: Nov. 2, 2023

(65) Prior Publication Data

US 2024/0066566 A1 Feb. 29, 2024

Related U.S. Application Data

(62) Division of application No. 16/542,014, filed on Aug. 15, 2019, now Pat. No. 11,839,907.

(Continued)

(51) Int. Cl.
*H01L 21/02* (2006.01)
*B08B 1/34* (2024.01)
(Continued)

(52) U.S. Cl.
CPC .......... *H01L 21/67046* (2013.01); *B08B 1/34* (2024.01); *B08B 1/52* (2024.01);
(Continued)

(58) Field of Classification Search
CPC ......... H01L 21/02052; H01L 21/67046; B08B 1/005; B08B 7/04
See application file for complete search history.

(56) References Cited

U.S. PATENT DOCUMENTS

| | | | |
|---|---|---|---|
| 6,579,797 | B1 | 6/2003 | Crevasse et al. |
| 2004/0000328 | A1 | 1/2004 | Liu et al. |

(Continued)

FOREIGN PATENT DOCUMENTS

| | | |
|---|---|---|
| JP | 2003-309097 A | 10/2003 |
| KR | 10-1338812 B1 | 12/2013 |

OTHER PUBLICATIONS

Hao-Yuan Guo et al., "Functional map of biological and biomimetic materials with hierarchical surface structures," RSC Adv., vol. 5, pp. 66901-66926 (2015).

(Continued)

*Primary Examiner* — Marc Lorenzi
(74) *Attorney, Agent, or Firm* — STUDEBAKER BRACKETT PLLC

(57) ABSTRACT

A method of cleaning wafer-cleaning brushes includes passing a wafer having a first polished main side and an opposing unpolished backside between a pair of substantially cylindrical shaped wafer-cleaning brushes are rotated about an axial direction of the brushes while passing the wafer between the pair of wafer-cleaning brushes. A cleaning solution is applied to the brushes while passing the wafer between the pair of wafer-cleaning brushes. While passing between the pair of brushes, the first polished main side of the wafer faces a first direction, the first direction is an opposite direction to which a polished side of a production wafer faces during a subsequent polished wafer cleaning operation. The substantially cylindrical shaped wafer-cleaning brushes include a plurality of protrusions on an external surface of the brushes, and the brushes contact the wafer at least a portion of time the wafer is passing between the pair of brushes.

20 Claims, 10 Drawing Sheets

Related U.S. Application Data

(60) Provisional application No. 62/719,435, filed on Aug. 17, 2018.

(51) Int. Cl.

| | |
|---|---|
| *B08B 1/52* | (2024.01) |
| *B08B 3/04* | (2006.01) |
| *B08B 3/08* | (2006.01) |
| *B08B 5/02* | (2006.01) |
| *B08B 7/02* | (2006.01) |
| *B08B 7/04* | (2006.01) |
| *H01L 21/67* | (2006.01) |
| *B08B 1/16* | (2024.01) |

(52) U.S. Cl.
CPC ............... *B08B 3/041* (2013.01); *B08B 3/08* (2013.01); *B08B 5/023* (2013.01); *B08B 7/028* (2013.01); *B08B 7/04* (2013.01); *H01L 21/02052* (2013.01); *B08B 1/165* (2024.01)

(56) References Cited

U.S. PATENT DOCUMENTS

| | | | |
|---|---|---|---|
| 2005/0109371 | A1 | 5/2005 | Sin et al. |
| 2006/0075969 | A1 | 4/2006 | Fischer |
| 2007/0095367 | A1 | 5/2007 | Wang et al. |
| 2007/0251035 | A1 | 11/2007 | Peng et al. |
| 2008/0276394 | A1 | 11/2008 | Sato |
| 2011/0094537 | A1 | 4/2011 | Ko et al. |
| 2016/0243593 | A1 | 8/2016 | Tanaka |
| 2016/0293402 | A1 | 10/2016 | Tien et al. |
| 2016/0329219 | A1 | 11/2016 | Lee et al. |
| 2017/0323807 | A1 | 11/2017 | Kweon et al. |

OTHER PUBLICATIONS

Bharat Bhushan and Michael Nosonovsky, "The rose petal effect and the modes of super hydrophobicity," Phil. Trans. of the Royal Society A, vol. 368, pp. 4713-4728 (2010).

Non-Final Office Action issued in U.S. Appl. No. 16/542,014, dated Jul. 8, 2021.

Final Office Action issued in U.S. Appl. No. 16/542,014, dated Oct. 21, 2021.

Non-Final Office Action issued in U.S. Appl. No. 16/542,014, dated Mar. 9, 2022.

Final Office Action issued in U.S. Appl. No. 16/542,014, dated Jun. 29, 2022.

Non-Final Office Action issued in U.S. Appl. No. 16/542,014, dated Oct. 13, 2022.

Final Office Action issued in U.S. Appl. No. 16/542,014, dated Apr. 18, 2023.

Notice of Allowance issued in U.S. Appl. No. 16/542,014, dated Aug. 2, 2023.

S410 — Rotate First and Second Wafer-Cleaning Brushes About Axial Direction of Brushes S420 — Contact Washboard to Each of First and Second Cleaning Brushes S430 — Apply Cleaning Solution to Brushes

400

BREAKING-IN AND CLEANING METHOD AND APPARATUS FOR WAFER-CLEANING BRUSH

CROSS-REFERENCE TO RELATED APPLICATIONS

This application is a divisional application of U.S. patent application Ser. No. 16/542,014, filed Aug. 15, 2019, now U.S. Pat. No. 11,839,907, which claims priority to U.S. Provisional Patent Application No. 62/719,435, filed Aug. 17, 2018, the entire disclosures of each of which are incorporated herein by reference.

BACKGROUND

New wafer-cleaning brushes and used wafer-cleaning brushes, such as post-chemical-mechanical polishing (CMP) cleaning brushes may have eluted ions, liquid-borne particles, and trace metals on their surfaces, which are potential defect sources for inline wafers during post-CMP cleaning. New wafer-cleaning brushes have to be broken in prior to use on a CMP line. The breaking in process is time-consuming and may require the use of hundreds of dummy wafers. A more efficient and thorough wafer-cleaning brush cleaning is desirable.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

It is to be understood that the following disclosure provides many different embodiments, or examples, for implementing different features of the disclosure. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of."

Figures 1A, 1B:
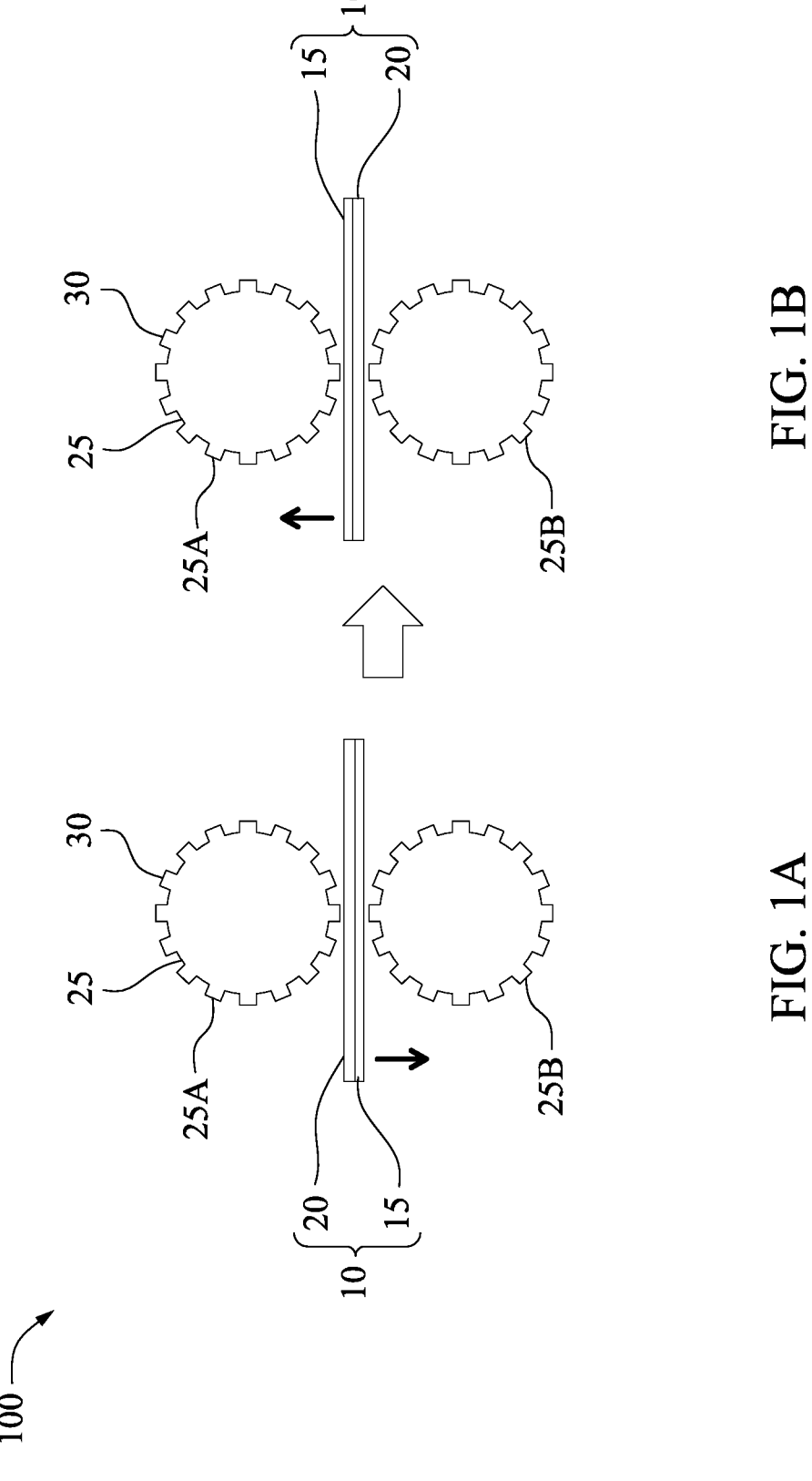
FIGS. 1A and 1B are schematic views of a wafer-cleaning brush breaking in or cleaning method according to embodiments of the present disclosure.

A method of cleaning wafer-cleaning brushes, such as post-chemical mechanical polishing (CMP) cleaning brushes, according to an embodiment of the present disclosure includes passing a wafer 10 having a first polished main side 15 and an opposing unpolished backside 20 between a pair of substantially cylindrical shaped wafer-cleaning brushes 25, as shown in FIG. 1A. The wafer-cleaning brushes 25 are rotated about an axial direction of the brushes 25 while passing the wafer 10 between the pair of wafer-cleaning brushes 25. A cleaning solution 55 is applied to the brushes 25 while passing the wafer 10 between the pair of wafer-cleaning brushes 25 (see FIGS. 4A, 4B, and 4C) in some embodiments. While passing between the pair of brushes 25 the first polished main side 15 of the wafer 10 faces a first direction. The first direction is an opposite direction to which a polished side of a production wafer faces during a subsequent polished wafer cleaning operation. The substantially cylindrical shaped wafer-cleaning brushes 25 include a plurality of protrusions 30 on an external surface of the brushes, and the brushes 25 contact the wafer 10 while the wafer 10 is passing between the pair of brushes 25.

In some embodiments, each main side of the wafer 10 is unpolished. In some embodiments, the wafer 10 is a dummy wafer. In some embodiments, each main side of the wafer 10 is polished.

In another embodiment, a method of cleaning wafer-cleaning brushes includes passing a wafer 10 having a first polished main side 15 and an opposing unpolished backside 20 between a pair of substantially cylindrical shaped wafer-cleaning brushes 25 two or more times. The wafer-cleaning brushes 25 are rotated about an axial direction of the brushes 25 while passing the wafer 10 between the pair of wafer-cleaning brushes 25. A cleaning solution 55 is applied to the brushes 25 while passing the wafer 10 between the pair of wafer-cleaning brushes 25 in some embodiments (see FIGS. 4A and 4B). While passing between the pair of brushes 25, the first polished main side 15 of the wafer 10 faces a first direction. The wafer 10 having a first polished main side 15 and an opposing unpolished backside 20 is passed between the pair of substantially cylindrical shaped wafer-cleaning brushes 25 a second time, or a second wafer 10 having a first polished main side 15 and an opposing unpolished backside 20 is passed between the pair of substantially cylindrical shaped wafer-cleaning brushes 25, as shown in FIG. 1B. While passing the wafer 10 a second time or passing the second wafer 10 between the wafer-cleaning brushes 25, the first polished main side of the wafer 15 or the second wafer 10 faces a second direction, and the second direction is opposite to the first direction. The substantially cylindrical shaped wafer-cleaning brushes 25 include a plurality of protrusions 30 on an external surface of the brushes 25, and the brushes 25 contact the wafer 10 while the wafer 10 is passing between the pair of brushes 25.

In some embodiments, the brushes 25 include a front brush 25A for cleaning the main surface 15 of a process wafer 10 subjected to a CMP operation and a rear brush 25B for cleaning the back side 20 of the process wafer 10. Because the front brush 25A is in contact with the main surface of the process wafer higher cleanliness is required of the front brush 25A than the rear brush 25B in some embodiments.

A roughness of the unpolished side 20 of the wafer 10 is greater than a roughness of the polished side 15. In some embodiments, the polished side 15 of the wafer 10 has a root mean square surface roughness ranging from about 0.05 nm to about 0.5 nm. In some embodiments, the unpolished side 20 of the wafer has a root mean square surface roughness ranging from about 0.1 µm to about 1 µm. In some embodiments, the rough surface 20 on the backside of the wafer provides more contact area on the brushes 25, thereby enhancing the mechanical agitation/displacement of the scrubbing during the brush breaking-in or cleaning process. In some embodiments, the wafer 10 is a dummy wafer. In some embodiments, both sides of the dummy wafer 10 are unpolished.

In some embodiments, the method is a breaking-in operation of new wafer-cleaning brushes.

In some embodiments, a washboard 35 (35a, 35b, 35c, 35d) contacts each of the pair of brushes while the brushes are rotating about their axes, as shown in FIGS. 2A, 2B, 3A, 3B, and 3C. A side of the brushes 25 contacting the washboard 35 is an opposite side of the brushes 25 to sides of the brushes 25 contacting the wafer 10.

Figures 2A, 2B:
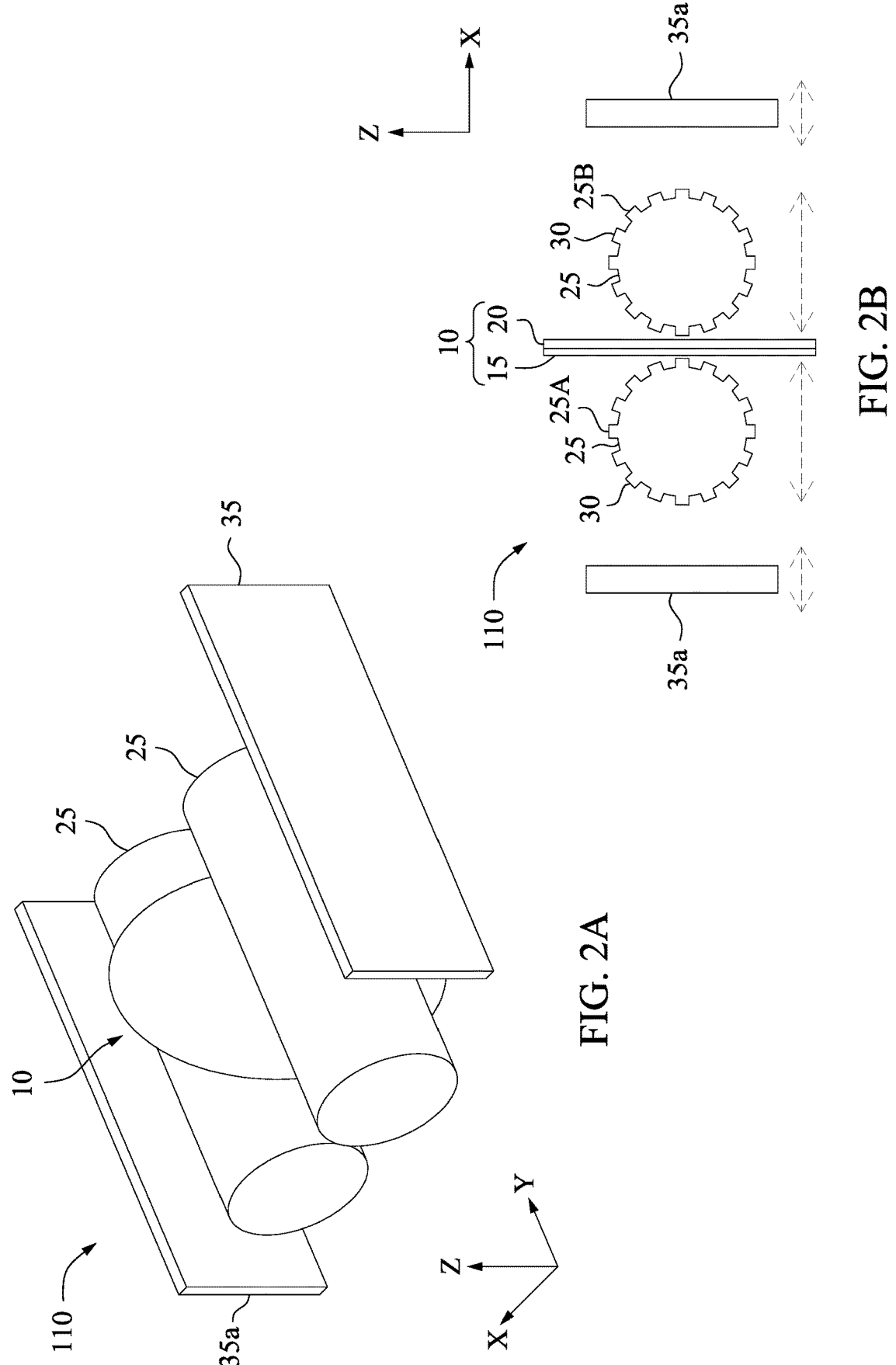
FIGS. 2A and 2B are schematic views of wafer-cleaning brush breaking in or cleaning apparatus according to embodiments of the present disclosure.

FIGS. 2A and 2B are schematic views of a wafer-cleaning brush breaking in or cleaning apparatus 110 according to embodiments of the present disclosure. FIG. 2A is a perspective view of the apparatus 110. A wafer 10 is cleaned or a pair of wafer-cleaning brushes 25 are broken in by passing a wafer 10 between a pair of wafer-cleaning brushes 25. A pair of washboards 35 are located on the outside of the pair of brushes 25. As shown in FIG. 2B, wafer 10 passes between the pair of brushes 25 by moving in the Z-direction, while the brushes 25 rotate around their axes. The brushes 25 are moved along the X-direction to contact the wafer 10. In some embodiments, the wafer 10 is a polished wafer, which is cleaned by the brushes 25. The washboards 35 are moveable in the X-direction. In some embodiments, at least one washboard 35 is moved into contact with one of the brushes 25. In some embodiments, the washboard 35 compresses the protrusions 30 on the brush 25, thereby removing debris from the surface of the brush 25 and cleaning the brush 25. In some embodiments, the side of the washboards 35a facing and contacting the brushes 25 has a substantially smooth surface. In some embodiments, the wafer 10 and brushes 25 are cleaned at the same time.

In some embodiments, each main side of the wafer 10 is unpolished. In some embodiments, the wafer 10 is a dummy wafer that is used to condition the brushes 25. In some embodiments, each main side of the wafer 10 is polished. In some embodiments, one main side of the wafer 10 is polished and the other main side of the wafer 10 is unpolished.

In some embodiments, the brushes 25 contact the wafer 10 for at least a portion of the time the wafer 10 is passing between the pair of brushes 25. In some embodiments, the cleaning brushes 25 are not in contact with the wafer 10 for a portion of the time the wafer 10 is passing between the pair of brushes 25. In some embodiments, the pair of brushes 25 are alternately in contact with and not in contact with the wafer 10 while the wafer 10 is passing between the first and second cleaning brushes 25. In some embodiments, the brushes 25 are controlled by a suitable controller, such as a programmable logic controller, to move into contact and away from contact with the wafer 10 in a cyclical manner while the wafer 10 is passing between the first and second cleaning brushes 25.

Figures 3A, 3B, 3C:
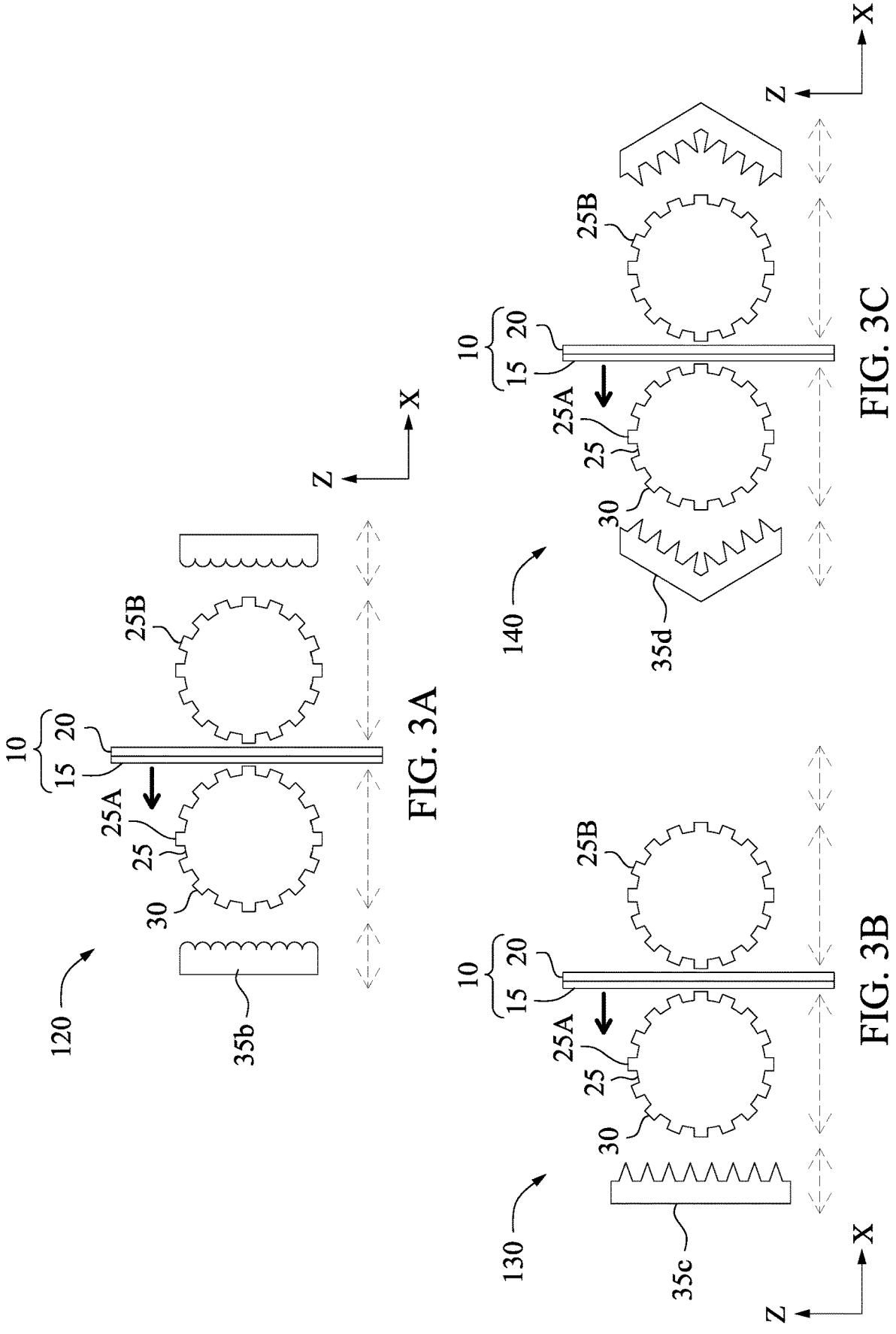
FIGS. 3A, 3B, and 3C are schematic views of a wafer-cleaning brush breaking-in or cleaning apparatuses according to some embodiments of the present disclosure.

FIGS. 3A, 3B, and 3C are schematic views of a wafer-cleaning brush breaking in or cleaning apparatuses 120, 130, 140 according to some embodiments of the present disclosure. In some embodiments of a wafer-cleaning brush breaking in or cleaning apparatus 120, as shown in FIG. 3A, at least one of the washboards 35b has a wave surface with wave peaks alternating with wave troughs along the surface. The wave height (or difference in height between the wave peak and wave trough) ranges between about 0.1 µm to about 10 µm in some embodiments.

In another embodiment of a wafer-cleaning brush breaking in or cleaning apparatus 130, at least one of the washboards 35c has a plurality of protrusions, as shown in FIG. 3B. The protrusions may be flat topped or spiked. The protrusions extend to a height of about 0.1 µm to about 10 µm from a main surface of the washboard 35 in some embodiments. In some embodiments, the washboards 35 have a root mean square surface roughness ranging from about 0.1 µm to about 10 mm. In other embodiments, the washboards 35 have a root mean square surface roughness ranging from about 0.5 µm to about 5 mm.

In another embodiment of a wafer-cleaning brush breaking in or cleaning apparatus 150, at least one of the washboards 35d has a curved surface or one of the washboards 35d has a plurality of surfaces extending in different planar directions, as shown in FIG. 3C. The curved surface washboard 35d or washboards 35d having a plurality of surfaces extending in different planar directions may also have a plurality of protrusions or a wave surface facing the brushes 25, as shown FIG. 3C.

As illustrated in FIGS. 3A, 3B, and 3C, the brushes 25 are configured to move closer to or away from the wafer 10 (i.e.—along the X-direction). The brushes 25 can be moved so that they contact the wafer 10 to clean the wafer or condition the brushes 25. Likewise, the washboards 35b, 35c, 35d are configured to move closer to or way from the brushes 25 (i.e.—along the X-direction) so that while the brushes 25 are rotating, they rub against the washboards 35b, 35c, 35d and are compressed. The action of rubbing against the washboards 35b, 35c, 35d cleans the surface of the brushes 25. In some embodiments, a surface of the brushes 25, including the protrusions 30, are compressed up to 2 mm during cleaning. In some embodiments, the brushes 25 are compressed greater than 2 mm during cleaning. In some embodiments, a polished wafer 10 is cleaned while the brushes 25 are being cleaned.

In some embodiments, the brushes 25 are cleaned or broken-in by contacting the washboards 35 to the brushes 25 without passing a wafer 10 between the pair of brushes 25. In some embodiments, the washboards 35 are alternately in contact with and not in contact with the pair of brushes 25 while the brushes 25 are being cleaned or broken-in. In some embodiments, the brushes 25 or washboards 35 are controlled by a suitable controller, such as a programmable logic controller, to move the brushes 25 and washboards into contact with each other and away from contact with each other in a cyclical manner during the cleaning or breaking-in operation. In some embodiments, a cleaning solution 55 (see FIG. 4) is applied to the brushes 25 during the cleaning or breaking-in operation.

In some embodiments, the washboards 35 (35*a*, 35*b*, 35*c*, 35*d*) include a polymer, ceramic, or quartz brush-contacting surface. In some embodiments, the polymer is one or more selected from the group consisting of an ultra high molecular weight polyethylene, a nylon, and a polyester. In some embodiments, the polymer is a hard polymer, while in other embodiments, the polymer is a soft polymer. In some embodiments, the hard polymer is a thermoset polymer, such as a phenolic resin; or a thermoplastic, such as ultra high molecular weight polyethylene, a nylon, or a polyester. In some embodiments, the soft polymer is an elastomer, such as a polyurethane elastomer. In some embodiments, the washboard includes a soft polymer surface disposed over a hard polymer core.

In some embodiments, the brushes are rotated at a speed of about 50 rpm to about 500 rpm during the breaking-in or cleaning methods.

Figures 4A, 4B:
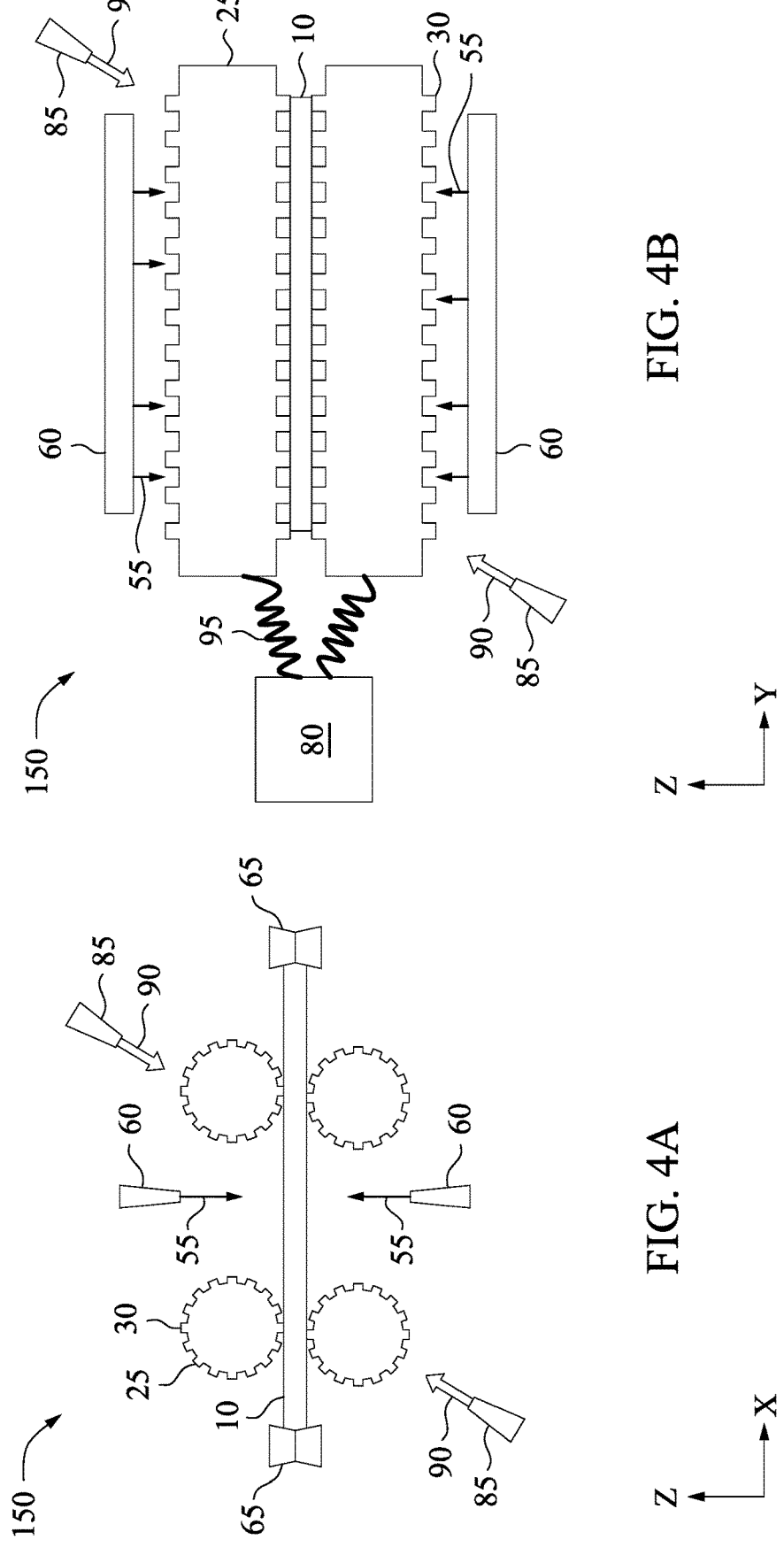
FIGS. 4A and 4B are schematic views of apparatuses for wafer-cleaning brush breaking in or cleaning according to embodiments of the present disclosure.
Figure 4D:
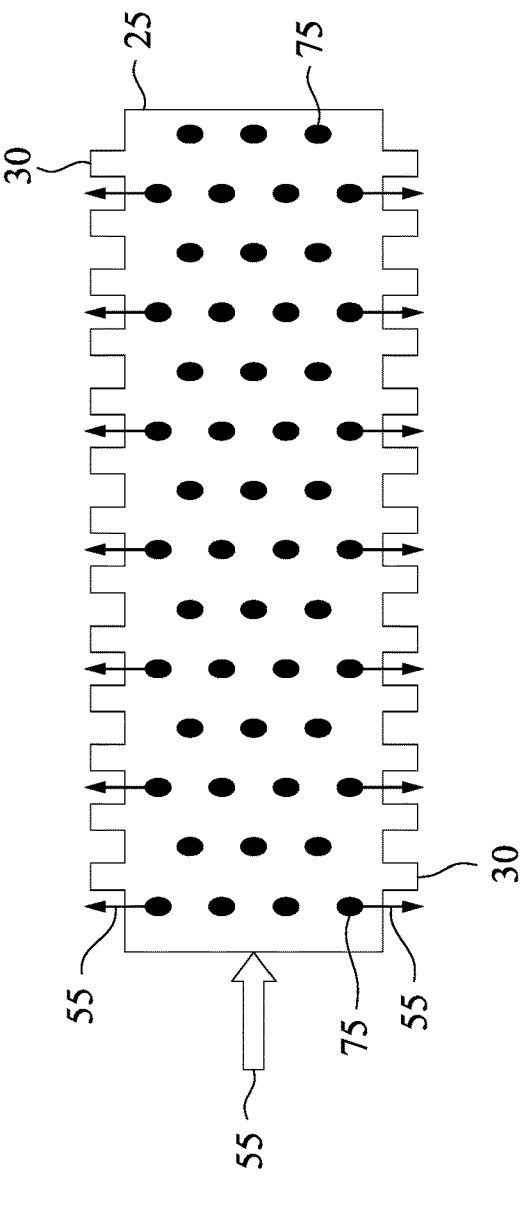
FIGS. 4C and 4D are detailed schematic views of a wafer-cleaning brush according to embodiments of the disclosure.
Figure 4C:
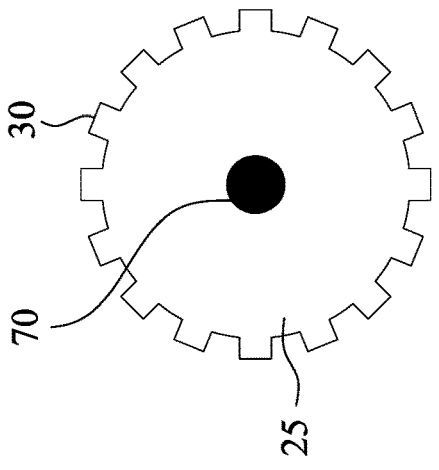

FIGS. 4A and 4B are schematic cross sectional views of an apparatus 150 for wafer-cleaning brush breaking in or cleaning according to embodiments of the present disclosure. FIGS. 4C and 4D are detailed views of a wafer-cleaning brush according to embodiments of the disclosure.

In some embodiments, a cleaning solution 55 is applied to the brushes 25 and/or wafer 10 from a manifold 60, as shown in FIGS. 4A and 4B. In some embodiments, the cleaning solution 55 includes at least one selected from the group consisting of SC-1, NH$_4$OH, tetramethyl ammonium hydroxide (TMAH), citric acid, HF, H$_2$O$_2$, H$_2$SO$_4$, and water. SC-1, (where SC stands for Standard Clean) is a solution made with a solution of 5 parts of deionized water, 1 part of ammonia water, (29% by weight of NH$_3$), 1 part of aqueous H$_2$O$_2$ (hydrogen peroxide, 30%) in some embodiments, and in other embodiments, the ratios of the SC-1 components vary. The SC-1 solution is applied at about 75° C. to about 80° C. for about 10 minutes. This SC-1 solution removes organic residues. Particles are also very effectively removed, even insoluble particles, since SC-1 modifies the surface and particle zeta potentials and causes the particles to repel. In some embodiments, about a 1:100 to about a 1:50 solution of aqueous HF (hydrofluoric acid) at about 25° C. is applied to remove thin oxide layers and ionic contaminants.

In some embodiments, SC-2 (Standard Clean-2) solution is applied. The SC-2 composition includes 6 parts of deionized water, 1 part of aqueous HCl (hydrochloric acid, 37% by weight), and 1 part of aqueous H$_2$O$_2$ (hydrogen peroxide, 30%) in some embodiments. In some embodiments, the ratios of the components of the SC-2 solution vary. In some embodiments, the SC-2 solution is applied at about 75° C. to about 80° C., for about 10 minutes. The SC-2 solution removes remaining traces of metallic (ionic) contaminants, which may have been introduced by previous cleaning operations. In some embodiments, the SC-2 solution leaves a thin passivating layer on the wafer surface, which protects the surface from subsequent contamination. In some embodiments, deionized water is applied to the brushes 25. In some embodiments, the apparatuses 110, 120, 130, 140, 150 include supply nozzles for the cleaning solution positioned and configured to apply the cleaning solution to the brushes or the wafers.

In some embodiments, the wafer 10 is oriented along a horizontal plane during the cleaning operations. In other embodiments, the wafer 10 is oriented along a vertical plane or any plane between horizontal and vertical orientations during the cleaning operations.

In some embodiments, the wafer 10 is rotated about its axis while passing between the brushes 25. As shown in FIG. 4A, in some embodiments, one or more rotation mechanisms 65 are used to rotate the wafer 10.

In some embodiments, the apparatus includes a gas dispenser 85 configured to apply a gas 90 to the brushes. In some embodiments, the gas 90 is applied to the brushes 25 while cleaning. In some embodiments, the gas 90 is at least one selected from the group consisting of nitrogen, carbon dioxide, air, ozone, neon, and argon. The gas 90 assists in the cleaning of debris from the brushes 25.

In some embodiments, the brushes 25 are made of suitable polymer. In some embodiments, the brushes 25 are made of a polyvinyl alcohol.

In some embodiments, a megasonic transducer 80 is configured to apply megasonic waves 95 to the brushes 25, as shown in FIG. 4B. The megasonic waves 95 assist in the cleaning of debris from the brushes 25. In some embodiments, the frequency of the megasonic waves 95 ranges from about 0.8 MHz to about 2 MHz. In some embodiments, the megasonic waves 95 and the cleaning solution 55 are applied to the brushes 25 at the same time. In some embodiments, the megasonic waves 95, cleaning solution 55, and gas 90 are applied to the brushes at the same time.

In some embodiments, the cleaning solution 55 is introduced to the brushes through a hollow 70 along an axial direction of the brushes 25, as shown in an end view of a brush 25 in FIG. 4C. The cleaning solution 55 is dispensed to the surface of the brushes 25, as shown in FIG. 4D, through radially extending passages 75 in the brushes connecting to the hollow 70.

In some embodiments, post-CMP cleaning includes removing particles and chemical contamination by buffing, brush cleaning, megasonic cleaning, and spin-rinse dry steps. In some embodiments, buffing includes polishing the wafers using soft pads after the main CMP operation.

In some embodiments, brush cleaning includes the use of polyvinyl alcohol brushes having a porosity of up to about 90%. In some embodiments, the cleaning solution applied during brush cleaning includes about 1% to about 2% NH$_4$OH to removal particles and prevent redeposition of particles, about 0.5% citric acid to remove metals, and HF to etch oxides to remove subsurface defects in some embodiments.

Methods and apparatuses of the present disclosure can integrated with a CMP apparatus, or can be applied to stand alone a brush cleaning box. One or more brushes can be cleaned according to embodiments of the present disclosure. Apparatuses according to the present disclosure be static or movable (translation or rotation) to engage the brush or to enhance mechanical agitation at the interface.

In some embodiments of the disclosure, the washboards 35 (35*a*, 35*b*, 35*c*, 35*d*) are solid or flexible, sponge-like foam-like, porous, or a combination of flat or curvy planes with macro, micro, or nano structures or with any hierarchical structures formed on the surface to contact with the brush. These structures can enhance or diminish adhesion/friction and hydrophobic/hydrophilic properties. In some embodiments, the washboard 35 surface properties, such as wettability, are modified or altered by applying specific coatings to the washboard surface. In some embodiments, the washboard 35 surfaces are modified to obtain a suitable wetting state on the surface of the washboard 35. Suitable wetting states of the washboard surfaces in some embodiments include the Wenzel state, Cassie-Baxter (Cassie) state, lotus state, and rose state. The wetting state models are shown in FIGS. 5A (Wenzel state), 5B (Cassie state), 5C (lotus state), and 5D (rose state).

Figures 5A, 5B, 5C, 5D:
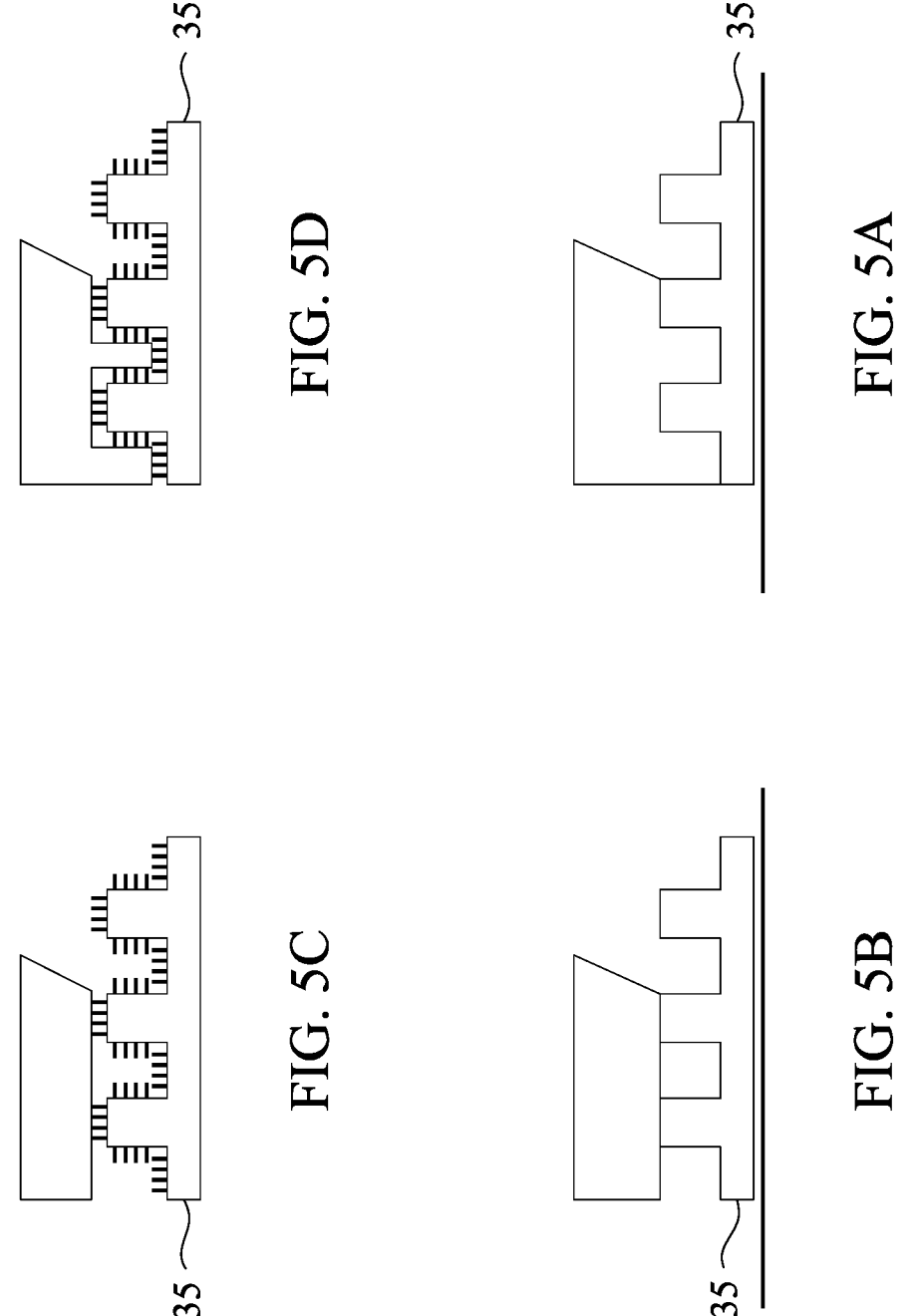
FIGS. 5A, 5B, 5C, and 5D show schematic views of washboard surfaces according to embodiments of the present disclosure.

In the Wenzel state, a liquid droplet impenetrates and fills all voids of the rough surface of the washboard 35 beneath the liquid, as shown in FIG. 5A. The Wenzel equation is expressed as $\cos\theta_r = r\cos\theta$, where $\theta_r$ is the apparent contact angle, r is the roughness factor, which is the ratio between the actual area of the rough surface and its projected area. Roughness enhances the surface hydrophilicity if the contact angle $\theta < 90°$ and enhances hydrophobicity if the contact angle $\theta > 90°$.

The Cassie state, as shown in FIG. 5B, is applicable when the surface of the washboard 35 includes two different types of material, a and b. The intrinsic contact angles $\theta_a$ and $\theta_b$, and their area fractions are $f_a$ and $f_b$, respectively. The Cassie-Baxter equation is $\cos\theta_r = f_a\cos\theta_a + f_b\cos\theta_b$, where $f_a + f_b = 1$. When material b is the air trapped in area between protrusions, $\theta_b = 180°$, and the Cassie-Baxter equation becomes $\cos\theta_r = f(\cos\theta + 1) - 1$. The Cassie-Baxter equation indicates that an originally hydrophilic surface can be made hydrophobic by when f is sufficiently small.

The lotus state, shown in FIG. 5C, is a state of superhydrophobicity having a liquid contact angle of greater than about 160°. Surfaces with the lotus wetting state are considered self-cleaning surfaces. Suitable chemical treatments and coating are used in some embodiments to provide a lotus wetting state of the washboard 35.

In the rose wetting state, a superhydrophobic surface has adhesive properties, so that the liquid fills the voids of the washboard 35 surface, as shown in FIG. 5D, similar to the Wenzel wetting state. The rose wetting state of the washboard 35 is achieved by treating the superhydrophobic surface to form nanostructures. In some embodiments, the surface of the washboard 35 is treated by photolithography, e-beam lithography, plasma etching, or deposition of nanoparticles.

Figure 6A:
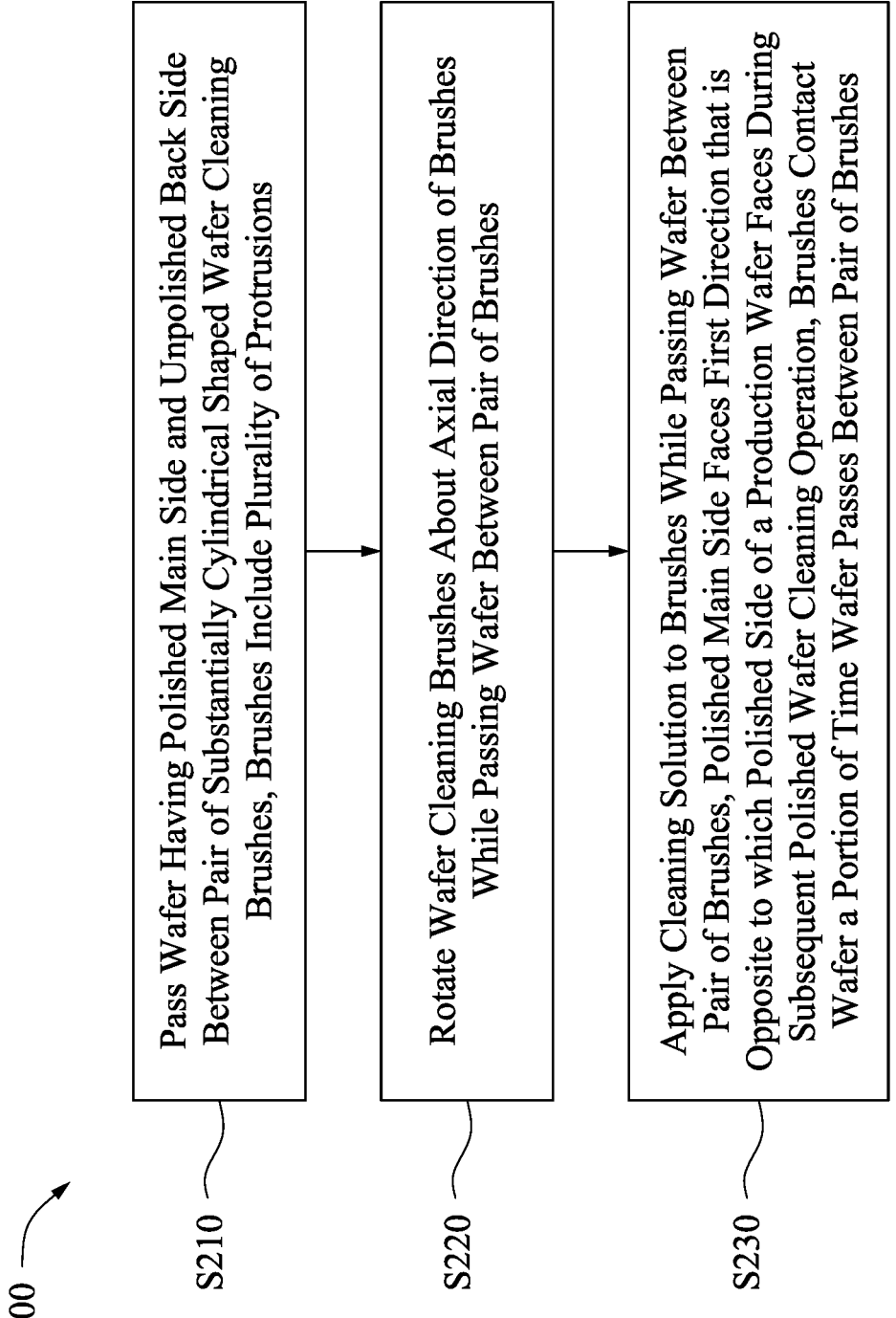
FIGS. 6A and 6B are flowcharts illustrating methods of cleaning or breaking-in wafer-cleaning brushes according to embodiments of the present disclosure.
Figure 6B:
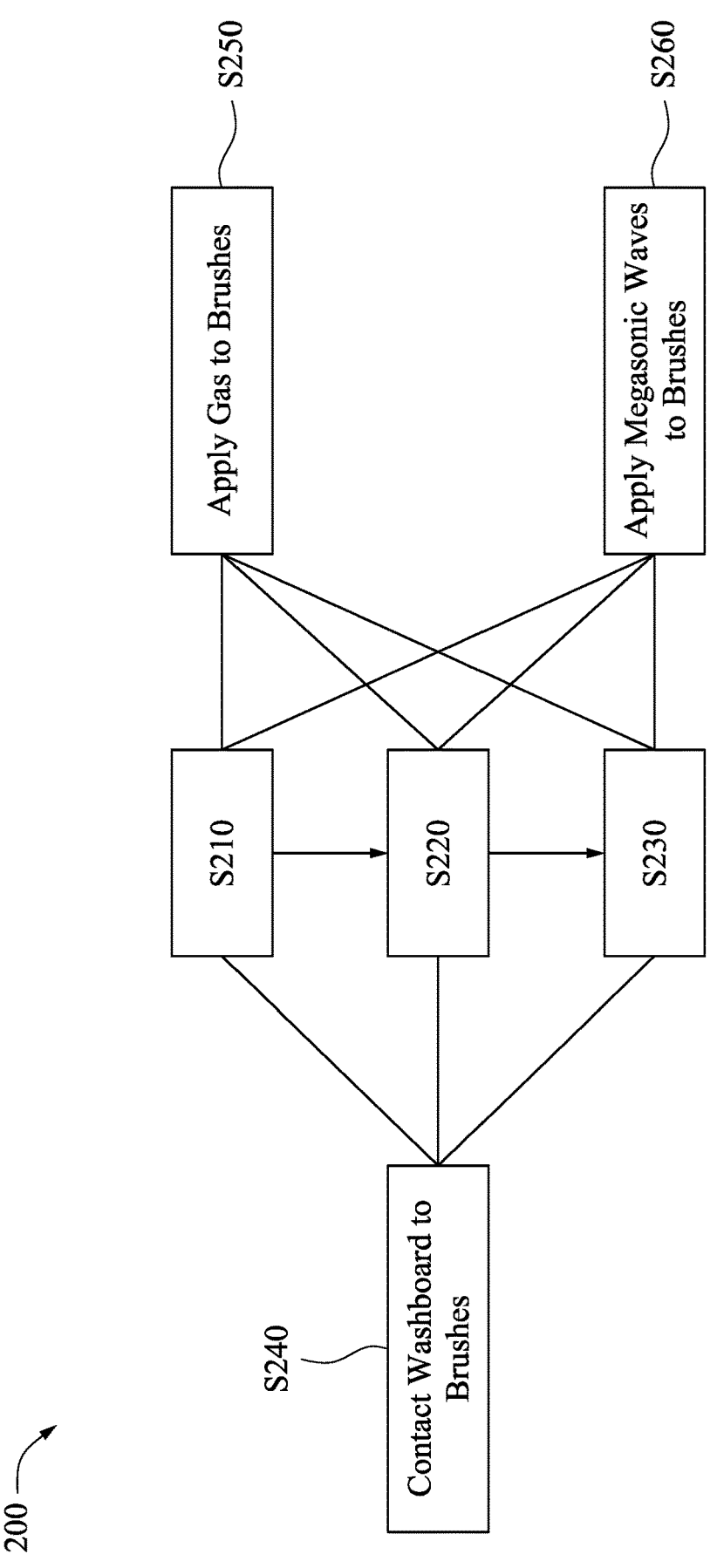

FIGS. 6A and 6B are flowcharts illustrating methods of cleaning wafer-cleaning brushes according to embodiments of the present disclosure. As shown in FIG. 6A, a method 200 of cleaning wafer-cleaning brushes, such as post-CMP cleaning brushes, includes an operation S210 of passing a wafer 10 having a first polished main side 15 and an opposing unpolished backside 20 between a pair of substantially cylindrical shaped wafer-cleaning brushes 25. In some embodiments, the wafer-cleaning brushes 25 include a plurality of protrusions 30. The wafer-cleaning brushes 25 are rotated about an axial direction of the brushes while passing the wafer 10 between the pair of wafer-cleaning brushes 25 in operation S220. A cleaning solution 55 is applied in operation S230 to the brushes 25 while passing the wafer 10 between the pair of wafer-cleaning brushes 25. While passing between the pair of brushes 25 the first polished main side 15 of the wafer faces a first direction, and the first direction is an opposite direction to which a polished side of a production wafer faces during a subsequent polished wafer cleaning operation. The substantially cylindrical shaped wafer-cleaning brushes 25 contact the wafer 10 while the wafer 10 is passing between the pair of brushes 25. In some embodiments, operations S210 to S230 are repeated one or more times.

As shown in FIG. 6B, in operation S240 at least one washboard 35 contacts the brushes 25 during any of or each operation S210, S220, and S230 disclosed herein in some embodiments. The washboards 35 contact a side of the brushes 25 opposite to the side of the brushes 25 contacting the wafer 10. In some embodiments, a gas 90 is applied to the brushes 25 in operation S250 during any of or each operation S210, S220, and S230 disclosed herein. In some embodiments, megasonic waves 95 are applied to the brushes 25 in operation S260 during any of or each operation S210, S220, and S230 disclosed herein. In some embodiments, the operations S240 contacting the washboard 35 to the brushes 25, S250 applying gas 90 to the brushes 25, and S260 applying megasonic waves 95 to the brushes 25 are performed substantially simultaneously.

Figure 7:
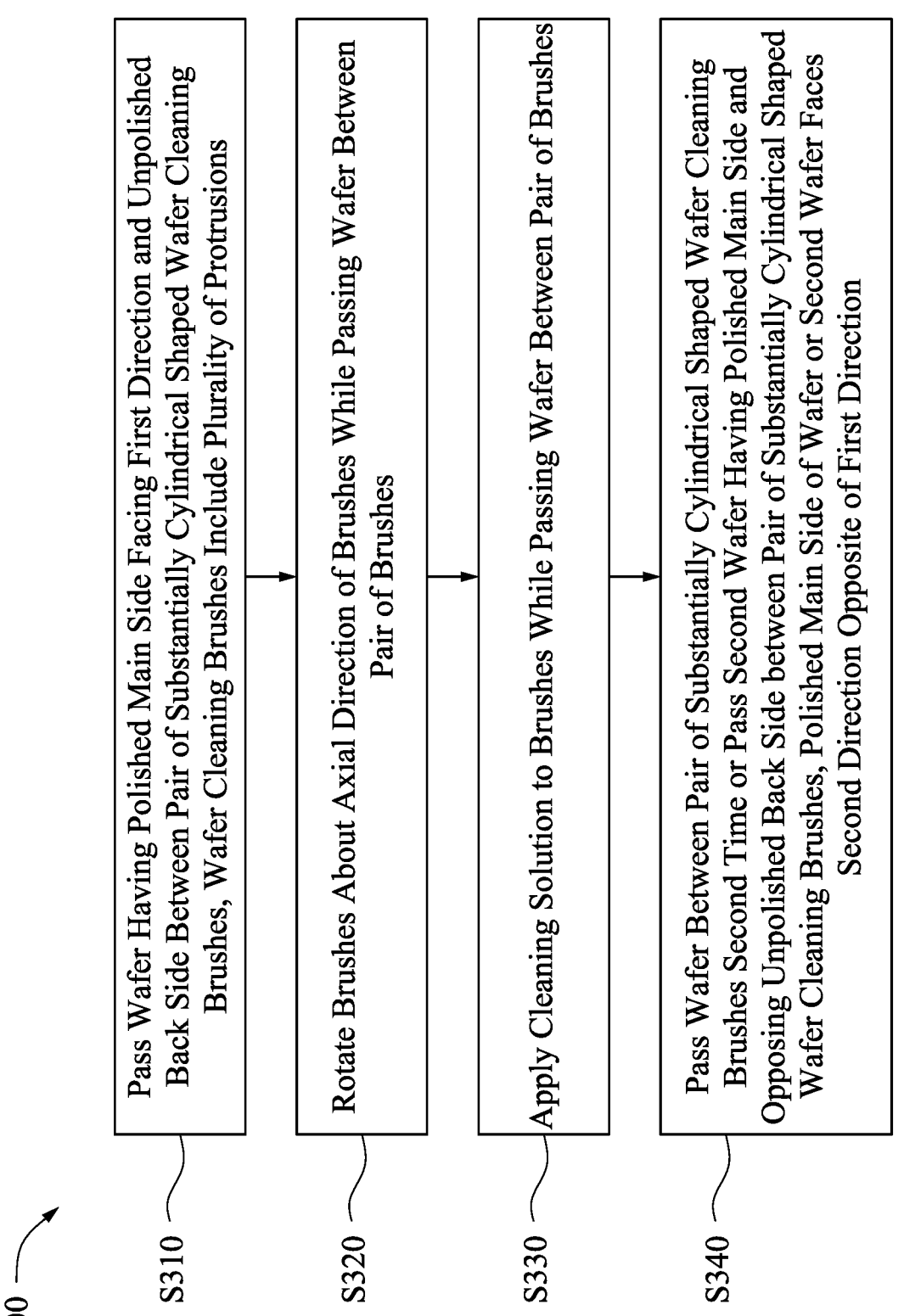
FIG. 7 is a flowchart illustrating a method of cleaning wafer-cleaning or breaking-in wafer cleaning brushes according to an embodiment of the present disclosure.

FIG. 7 is a flowchart illustrating a method 300 of cleaning wafer-cleaning brushes, such as post-CMP cleaning brushes, according to an embodiment of the present disclosure. The method 300 of cleaning wafer-cleaning brushes includes an operation S310 of passing a wafer 10 having a first polished main side 15 and an opposing unpolished backside 20 between a pair of substantially cylindrical shaped wafer-cleaning brushes 25. While the wafer 10 is passing between the brushes 25, the brushes contact the wafer 10. The wafer-cleaning brushes 25 are rotated about an axial direction of the brushes 25 while passing the wafer 10 between the pair of wafer-cleaning brushes 25 in operation S320. In operation S330, a cleaning solution 55 is applied to the brushes 25 while passing the wafer 10 between the pair of wafer-cleaning brushes 25. While passing between the pair of brushes 25, the first polished main side 15 of the wafer faces a first direction. In operation S340, the wafer 10 having a first polished main side 15 and an opposing unpolished backside 20 is passed between the pair of substantially cylindrical shaped wafer-cleaning brushes 25 a second time, or a second wafer 10 having a first polished main side 15 and an opposing unpolished backside 20 is passed between the pair of substantially cylindrical shaped wafer-cleaning brushes 25. While passing the wafer a second time or passing the second wafer between the wafer-cleaning brushes, the first polished main side 15 of the wafer 10 or the second wafer 10 faces a second direction, and the second direction is opposite to the first direction. The substantially cylindrical shaped wafer-cleaning brushes 25 include a plurality of protrusions 30 on an external surface of the brushes 25, and the brushes 25 contact the wafer 10 while the wafer is passing between the pair of brushes.

Figure 8:
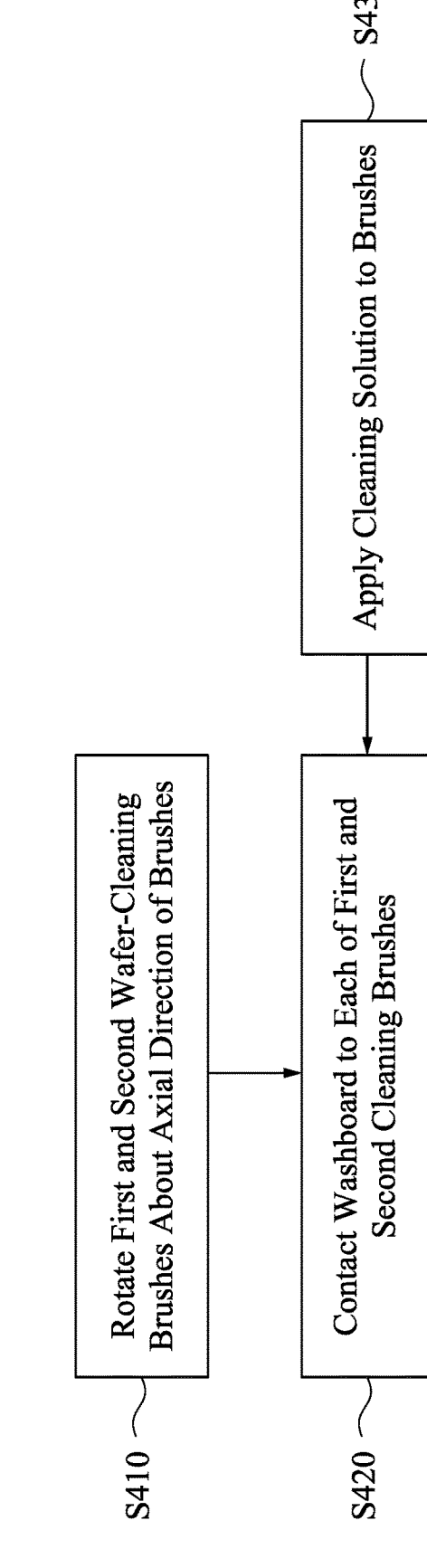
FIG. 8 is a flowchart illustrating a method of cleaning or breaking-in wafer-cleaning brushes according to an embodiment of the present disclosure.

FIG. 8 is a flowchart illustrating a method 400 of cleaning or breaking-in wafer-cleaning brushes, such as post-CMP cleaning brushes, according to an embodiment of the present disclosure. The method 400 of cleaning or breaking-in wafer-cleaning brushes includes an operation S410 of rotating the first and second cleaning brushes 25 and an operation S420 of contacting washboards 35 to each of the first and second cleaning brushes 25 while the first and second cleaning brushes 25 are rotating about their axes. A cleaning solution 55 is applied to the brushes while contacting the first and second cleaning brushes 25 to the washboard 35 in operation S430. In some embodiments, the substantially cylindrical shaped wafer-cleaning brushes 25 include a plurality of protrusions 30 on an external surface of the brushes 25. In some embodiments, the washboards 35 are located outside the pair of brushes 25 and one each of the washboards 35 is configured to contact one of the pair of brushes 25. In some embodiments, one of the washboards 35*b* has a wave surface. In some embodiments, one of the washboards 35*c* has a plurality of protrusions. In some embodiments, one of the washboards 35*d* has a curved surface or one of the washboards 35*d* has a plurality of surfaces extending in different planar directions. In some embodiments, one of the washboards 35*a* has a smooth surface.

Embodiments of the present disclosure provide higher contact area between the brush and washboard due to the roughness of the washboard. Angled or curved washboards provide a larger contact area with the brush. Brushes can be cleaned at any time including during wafer processing. Wafer brush cleaning methods and apparatuses according to the present disclosure speed up the brush breaking-in and cleaning operations, improve the quality of the breaking-in process, and prolong brush life.

An embodiment of the disclosure is a method of cleaning wafer-cleaning brushes, including passing a wafer having a first polished main side and an opposing unpolished backside between a pair of substantially cylindrical shaped wafer-cleaning brushes. The wafer-cleaning brushes are rotated about an axial direction of the brushes while passing the wafer between the pair of wafer-cleaning brushes. A cleaning solution is applied to the brushes while passing the wafer between the pair of wafer-cleaning brushes. While passing between the pair of brushes the first polished main side of the wafer faces a first direction, and the first direction is an opposite direction to which a polished side of a production wafer faces during a subsequent polished wafer cleaning operation. The substantially cylindrical shaped wafer-cleaning brushes include a plurality of protrusions on an external surface of the brushes, and the brushes contact the wafer for at least of a portion of time the wafer is passing between the pair of brushes. In an embodiment, the polished side of the wafer has a root mean square surface roughness ranging from 0.05 nm to 0.5 nm. In an embodiment, the unpolished side of the wafer has a root mean square surface roughness ranging from 0.1 μm to 1 μm. In an embodiment, the wafer is a dummy wafer. In an embodiment, the cleaning method is a breaking-in operation of new wafer-cleaning brushes. In an embodiment, the cleaning solution includes at least one selected from the group consisting of SC1, $NH_4OH$, tetramethyl ammonium hydroxide, citric acid, HF, $H_2O_2$, $H_2SO_4$, and water. In an embodiment, the method includes applying a gas to the brushes while cleaning, wherein the gas is at least one selected from the group consisting of nitrogen, carbon dioxide, air, ozone, neon, and argon. In an embodiment, the brushes are made of polyvinyl alcohol. In an embodiment, the method includes applying megasonic waves to the brushes. In an embodiment, the method includes contacting a washboard to each of the pair of brushes while the brushes are rotating about their axes, and a side of the brushes contacting the washboard is an opposite side of the brushes to sides of the brushes contacting the wafer. In an embodiment, one of the washboards has a wave surface. In an embodiment, one of the washboards has a plurality of protrusions. In an embodiment, one of the washboards has a curved surface or one of the washboards has a plurality of surfaces extending in different planar directions. In an embodiment, one of the washboards has a smooth surface. In an embodiment, a surface of the brushes are compressed up to 2 mm during the cleaning. In an embodiment, a polished wafer is cleaned while the brushes are being cleaned. In an embodiment, the cleaning solution is applied to the brushes and/or wafer from a manifold. In an embodiment, the cleaning solution is introduced to the brushes through a hollow along an axial direction of the brushes, and the cleaning solution is dispersed to the surface of the brushes through radially extending passages in the brushes. In an embodiment, the washboards have a root mean square surface roughness ranging from 0.1 μm to 10 mm. In an embodiment, the wafer is rotated about its axis while passing between the brushes. In an embodiment, the first and second cleaning brushes are not in contact with the wafer for a portion of the time the wafer is passing between the pair of brushes. In an embodiment, the pair of brushes are alternately in contact with and not in contact with the wafer while the wafer is passing between the first and second cleaning brushes.

Another embodiment of the disclosure is an apparatus for breaking-in or cleaning wafer-cleaning brushes, including a pair of opposing substantially cylindrical shaped wafer-cleaning brushes, wherein the brushes are configured to rotate about their axes. A cleaning solution dispenser is configured to dispense cleaning solution on the brushes. The apparatus includes a pair of washboards, wherein each of the pair of the washboards is located outside the pair of brushes and one each of the pair of washboards is configured to contact one of the pair of brushes. The substantially cylindrical shaped wafer-cleaning brushes include a plurality of protrusions on an external surface of the brushes. In an embodiment, the washboard includes a polymer, ceramic, or quartz brush-contacting surface. In an embodiment, the polymer is one or more selected from the group consisting of ultra high molecular weight polyethylene, nylon, and polyester. In an embodiment, the apparatus includes a gas dispenser configured to apply a gas to the brushes. In an embodiment, the brush comprises polyvinyl alcohol. In an embodiment, the apparatus includes a megasonic wave transducer configured to apply megasonic waves to the brushes. In an embodiment, one of the washboards has a wave surface. In an embodiment, one of the washboards has a plurality of protrusions. In an embodiment, one of the washboards has a curved surface or one of the washboards has a plurality of surfaces extending in different planar directions. In an embodiment, one of the washboards has a smooth surface. In an embodiment, the apparatus includes a manifold configured to apply the cleaning solution to the brushes. In an embodiment, the brushes include a hollow along an axial direction of the brushes through which cleaning solution is introduced, radially extending passages connected to the hollow through which cleaning solution is dispensed to a surface of the brushes. In an embodiment, the washboards have a root mean square surface roughness ranging from 0.1 μm to 10 mm. In an embodiment, the apparatus includes a plurality of rollers configured to rotate a wafer being cleaned in the apparatus.

Another embodiment of the disclosure is a method of cleaning wafer-cleaning brushes, including passing a wafer having a first polished main side and an opposing unpolished backside between a pair of substantially cylindrical shaped wafer-cleaning brushes. The wafer-cleaning brushes are rotated about an axial direction of the brushes while passing the wafer between the pair of wafer-cleaning brushes. A cleaning solution is applied to the brushes while passing the wafer between the pair of wafer-cleaning brushes. While passing between the pair of brushes the first polished main side of the wafer faces a first direction. The wafer having a first polished main side and an opposing unpolished backside is passed between the pair of substantially cylindrical shaped wafer-cleaning brushes a second time, or a second wafer having a first polished main side and an opposing unpolished backside is passed between the pair of substantially cylindrical shaped wafer-cleaning brushes. While passing the wafer a second time or passing the second wafer between the pair of wafer-cleaning brushes the first polished main side of the wafer or the second wafer faces a second direction, and the second direction is opposite to the first direction. The substantially cylindrical shaped wafer-cleaning brushes include a plurality of protrusions on an external surface of the brushes, and the brushes contact the wafer for at least a portion of time the wafer is passing between the pair of brushes. In an embodiment, the first and second cleaning brushes are not in contact with the wafer for a portion of the time the wafer is passing between the pair of brushes. In an embodiment, the pair of brushes are alternately in contact with and not in contact with the wafer while the wafer is passing between the first and second cleaning brushes.

Another embodiment of the disclosure is a method of cleaning wafer-cleaning brushes, including passing a dummy wafer having at least one unpolished main side between a pair of substantially cylindrical shaped first and second wafer-cleaning brushes. An unpolished main side of the dummy wafer faces the first wafer-cleaning brush. The first and second wafer-cleaning brushes are rotated about an axial direction of the brushes while passing the dummy wafer between the pair of wafer-cleaning brushes. A cleaning solution is applied to the brushes while passing the dummy wafer between the pair of wafer-cleaning brushes. A process wafer having a first polished main side and an opposing unpolished backside is passed between the pair of substantially cylindrical shaped first and second wafer-cleaning brushes. While passing the process wafer between the pair of wafer-cleaning brushes the first polished main side of the process wafer faces the first wafer-cleaning brush. The substantially cylindrical shaped wafer-cleaning brushes include a plurality of protrusions on an external surface of the brushes, and the brushes contact the wafer for at least a portion of time the wafer is passing between the pair of brushes. In an embodiment, the dummy wafer is passed between the pair of wafer-cleaning brushes a plurality of times. In an embodiment, a second dummy wafer is passed between the pair of wafer-cleaning brushes after a first dummy wafer, and a polished side of the second dummy wafer faces the first cleaning brush. In an embodiment, a plurality of process wafers are passed between the pair of wafer-cleaning brushes after the dummy wafer is passed between the pair of wafer-cleaning brushes. In an embodiment, the first and second cleaning brushes are not in contact with the wafer for a portion of the time the wafer is passing between the pair of brushes. In an embodiment, the pair of brushes are alternately in contact with and not in contact with the wafer while the wafer is passing between the first and second cleaning brushes.

Another embodiment of the disclosure is a method of cleaning wafer-cleaning brushes, including passing a first wafer between a pair of substantially cylindrical shaped first and second wafer-cleaning brushes. The first and second wafer-cleaning brushes are rotated about an axial direction of the brushes while passing the first wafer between the pair of wafer-cleaning brushes. A cleaning solution is applied to the brushes while passing the first wafer between the pair of wafer-cleaning brushes. A washboard is contacted to each of the first and second cleaning brushes while the first and second cleaning brushes are rotating about their axes. In an embodiment, the substantially cylindrical shaped wafer-cleaning brushes include a plurality of protrusions on an external surface of the brushes. In an embodiment, each main side of the first wafer is unpolished. In an embodiment, each main side of the first wafer is polished. In an embodiment, one main side of the first wafer is polished and the other main side of the first wafer is unpolished. In an embodiment, the washboards are located outside the pair of brushes and one each of the washboards is configured to contact one of the pair of brushes. In an embodiment, a side of the brushes contacting the washboard is an opposite side of the brushes facing the first wafer. In an embodiment, the washboards include a polymer, ceramic, or quartz brush-contacting surface. In an embodiment, the polymer is one or more selected from the group consisting of ultra high molecular weight polyethylene, nylon, and polyester. In an embodiment, one of the washboards has a wave surface. In an embodiment, one of the washboards has a plurality of protrusions. In an embodiment, one of the washboards has a curved surface or one of the washboards has a plurality of surfaces extending in different planar directions. In an embodiment, one of the washboards has a smooth surface. In an embodiment, the first wafer is passed between the pair of wafer-cleaning brushes a plurality of times. In an embodiment, a second wafer is passed between the pair of wafer-cleaning brushes after the first wafer. In an embodiment, a plurality of wafers are passed between the pair of wafer-cleaning brushes after the first wafer is passed between the pair of wafer-cleaning brushes. In an embodiment, the first and second cleaning brushes are not in contact with the wafer for a portion of the time the wafer is passing between the pair of brushes. In an embodiment, the pair of brushes are alternately in contact with and not in contact with the wafer while the wafer is passing between the first and second cleaning brushes.

Another embodiment of the disclosure is a method of cleaning wafer-cleaning brushes, including rotating first and second wafer-cleaning brushes about an axial direction of the brushes. A washboard is contacted to each of the first and second cleaning brushes while the first and second cleaning brushes are rotating about their axes. A cleaning solution is applied to the brushes while contacting the first and second cleaning brushes to the washboard. In an embodiment, the substantially cylindrical shaped wafer-cleaning brushes include a plurality of protrusions on an external surface of the brushes. In an embodiment, the washboards are located outside the pair of brushes and one each of the washboards is configured to contact one of the pair of brushes. In an embodiment, the washboards include a polymer, ceramic, or quartz brush-contacting surface. In an embodiment, the polymer is one or more selected from the group consisting of ultra high molecular weight polyethylene, nylon, and polyester. In an embodiment, one of the washboards has a wave surface. In an embodiment, one of the washboards has a plurality of protrusions. In an embodiment, one of the washboards has a curved surface or one of the washboards has a plurality of surfaces extending in different planar directions. In an embodiment, one of the washboards has a smooth surface. In an embodiment, a first wafer is passed between the pair of substantially cylindrical shaped first and second wafer-cleaning brushes while the first and second wafer-cleaning brushes are contacting the washboards. In an embodiment, a side of the brushes contacting the washboards is an opposite side of the brushes to sides of the brushes contacting the wafer. In an embodiment, each main side of the first wafer is unpolished. In an embodiment, each main side of the first wafer is polished. In an embodiment, one main side of the first wafer is polished and the other main side of the first wafer is unpolished. In an embodiment, the first wafer is passed between the pair of wafer-cleaning brushes a plurality of times. In an embodiment, a second wafer is passed between the pair of wafer-cleaning brushes after the first wafer. In an embodiment, a plurality of wafers are passed between the pair of wafer-cleaning brushes after the first wafer is passed between the pair of wafer-cleaning brushes.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of cleaning wafer-cleaning brushes, comprising:

passing a dummy wafer having at least one unpolished main side between first and second cylindrical-shaped wafer-cleaning brushes, wherein an unpolished main side of the dummy wafer faces the first cylindrical-shaped wafer-cleaning brush;

rotating the first and second cylindrical-shaped wafer-cleaning brushes about an axial direction of the brushes while passing the dummy wafer between brushes;

applying a cleaning solution and megasonic waves to the brushes while passing the dummy wafer between the brushes;

cleaning a process wafer having a first polished main side and an opposing unpolished backside by passing the process wafer between the brushes, wherein while passing the process wafer between the first and second cylindrical-shaped wafer-cleaning brushes, the first polished main side of the process wafer faces a first direction toward the first cylindrical-shaped wafer-cleaning brush; and contacting a first washboard to the first cylindrical-shaped wafer-cleaning brush and contacting a second washboard to the second cylindrical-shaped wafer-cleaning brush, wherein the first and second washboards are respectively contacted to the first and second cylindrical-shaped wafer-cleaning brushes while the brushes are rotating about their axes, wherein a side of the first cylindrical-shaped wafer-cleaning brush oriented to contact the first washboard is opposite to a side of the first cylindrical-shaped wafer-cleaning brush oriented to contact the process wafer, a side of the second cylindrical-shaped wafer-cleaning brush oriented to contact the second washboard is opposite to a side of the second cylindrical-shaped wafer-cleaning brush oriented to contact the process wafer, wherein the first and second cylindrical-shaped wafer-cleaning brushes and the first and second washboards are controlled by a controller to move into contact with each other and away from contact with each other in a cyclical manner during the cleaning the process wafer, wherein the first and second cylindrical-shaped wafer-cleaning brushes are controlled by the controller to move into contact and away from contact with the process wafer in a cyclical manner while the process wafer is passing between the brushes, and

wherein external surfaces of the first and second cylindrical-shaped wafer-cleaning brushes include a plurality of protrusions, and the brushes contact the process wafer for at least a portion of time the process wafer is passing between the brushes.

2. The method according to claim 1, wherein the external surfaces of the brushes are compressed greater than 2 mm during cleaning.

3. The method according to claim 1, wherein the first washboard and the second washboard have a root mean square surface roughness ranging from 0.1 µm to 10 mm.

4. The method according to claim 1, wherein the process wafer is cleaned while the brushes are being cleaned.

5. The method according to claim 1, wherein the cleaning solution is applied to the brushes from a manifold.

6. The method according to claim 1, wherein the cleaning solution is introduced to the brushes through a hollow along the axial direction of the brushes, and the cleaning solution is dispensed to the external surfaces of the brushes through radially extending passages in the brushes.

7. A method of cleaning wafer-cleaning brushes, comprising:

passing a dummy wafer having at least one unpolished main side between first and second cylindrical-shaped wafer-cleaning brushes, wherein an unpolished main side of the dummy wafer faces the first cylindrical-shaped wafer-cleaning brush;

rotating the first and second cylindrical-shaped wafer-cleaning brushes about an axial direction of the brushes while passing the dummy wafer between brushes;

applying a cleaning solution and megasonic waves to the brushes while passing the dummy wafer between the brushes;

cleaning a process wafer having a first polished main side and an opposing unpolished backside by passing the process wafer between the brushes, wherein while passing the process wafer between the first and second cylindrical-shaped wafer-cleaning brushes, the first polished main side of the process wafer faces a first direction toward the first cylindrical-shaped wafer-cleaning brush; and contacting a first washboard to the first cylindrical-shaped wafer-cleaning brush and contacting a second washboard to the second cylindrical-shaped wafer-cleaning brush, wherein the first and second washboards are respectively contacted to the first and second cylindrical-shaped wafer-cleaning brushes while the brushes are rotating about their axes, wherein a side of the first cylindrical-shaped wafer-cleaning brush oriented to contact the first washboard is opposite to a side of the first cylindrical-shaped wafer-cleaning brush oriented to contact the process wafer, a side of the second cylindrical-shaped wafer-cleaning brush oriented to contact the second washboard is opposite to a side of the second cylindrical-shaped wafer-cleaning brush oriented to contact the process wafer, wherein the first and second cylindrical-shaped wafer-cleaning brushes and the first and second washboards are controlled by a controller to move into contact with each other and away from contact with each other in a cyclical manner during the cleaning the process wafer, wherein the first and second cylindrical-shaped wafer-cleaning brushes are controlled by the controller to move into contact and away from contact with the process wafer in a cyclical manner while the process wafer is passing between the brushes, wherein external surfaces of the first and second cylindrical-shaped wafer-cleaning brushes include a plurality of protrusions, and the brushes contact the process wafer for at least a portion of time the process wafer is passing between the brushes, and wherein the process wafer is rotated about an axis of the process wafer while passing between the brushes.

8. The method according to claim 7, wherein the external surfaces of the brushes are compressed greater than 2 mm during cleaning.

9. The method according to claim 7, wherein the first washboard and the second washboard have a root mean square surface roughness ranging from 0.1 µm to 10 mm.

10. The method according to claim 7, wherein the process wafer is cleaned while the brushes are being cleaned.

11. The method according to claim 7, wherein the cleaning solution is applied to the brushes from a manifold.

12. The method according to claim 7, wherein the cleaning solution is introduced to the brushes through a hollow along the axial direction of the brushes, and the cleaning solution is dispensed to the external surfaces of the brushes through radially extending passages in the brushes.

13. The method according to claim 10, wherein the cleaning solution is applied to the brushes from a manifold.

14. A method of cleaning wafer-cleaning brushes, comprising:

passing a dummy wafer having at least one unpolished main side between first and second cylindrical-shaped wafer-cleaning brushes, wherein an unpolished main side of the dummy wafer faces the first cylindrical-shaped wafer-cleaning brush;

rotating the first and second cylindrical-shaped wafer-cleaning brushes about an axial direction of the brushes while passing the dummy wafer between brushes;

applying a cleaning solution and megasonic waves to the brushes while passing the dummy wafer between the brushes;

cleaning a process wafer having a first polished main side and an opposing unpolished backside by passing the process wafer between the brushes, wherein while passing the process wafer between the first and second cylindrical-shaped wafer-cleaning brushes, the first polished main side of the process wafer faces a first direction toward the first cylindrical-shaped wafer-cleaning brush; and contacting a first washboard to the first cylindrical-shaped wafer-cleaning brush and contacting a second washboard to the second cylindrical-shaped wafer-cleaning brush, wherein the first and second washboards are respectively contacted to the first and second cylindrical-shaped wafer-cleaning brushes while the brushes are rotating about their axes, wherein a side of the first cylindrical-shaped wafer-cleaning brush oriented to contact the first washboard is opposite to a side of the first cylindrical-shaped wafer-cleaning brush oriented to contact the process wafer, a side of the second cylindrical-shaped wafer-cleaning brush oriented to contact the second washboard is opposite to a side of the second cylindrical-shaped wafer-cleaning brush oriented to contact the process wafer, wherein the first and second cylindrical-shaped wafer-cleaning brushes and the first and second washboards are controlled by a controller to move into contact with each other and away from contact with each other in a cyclical manner during the cleaning the process wafer, wherein the first and second cylindrical-shaped wafer-cleaning brushes are controlled by the controller to move into contact and away from contact with the process wafer in a cyclical manner while the process wafer is passing between the brushes, wherein external surfaces of the first and second cylindrical-shaped wafer-cleaning brushes include a plurality of protrusions, and the brushes contact the process wafer for at least a portion of time the process wafer is passing between the brushes, and wherein a frequency of the megasonic waves ranges from 0.8 MHz to 2 MHz to the brushes while passing the dummy wafer between the brushes.

15. The method according to claim 14, wherein the external surfaces of the brushes are compressed greater than 2 mm during cleaning.

16. The method according to claim 14, wherein the first washboard and the second washboard have a root mean square surface roughness ranging from 0.1 µm to 10 mm.

17. The method according to claim 14, wherein the process wafer is cleaned while the brushes are being cleaned.

18. The method according to claim 14, wherein the cleaning solution is applied to the brushes from a manifold.

19. The method according to claim 14, wherein the cleaning solution is introduced to the brushes through a hollow along the axial direction of the brushes, and the cleaning solution is dispensed to the external surfaces of the brushes through radially extending passages in the brushes.

20. The method according to claim 17, wherein the cleaning solution is applied to the brushes from a manifold.

* * * * *